United States Patent
Qi et al.

(10) Patent No.: US 11,804,828 B2
(45) Date of Patent: Oct. 31, 2023

(54) DUAL DUTY CYCLE CORRECTION LOOP FOR A SERIALIZER/DESERIALIZER (SERDES) TRANSMITTER OUTPUT

(71) Applicant: International Business Machines Corporation, Armonk, NY (US)

(72) Inventors: Jieming Qi, Austin, TX (US); Daniel Mark Dreps, Georgetown, TX (US); Glen A. Wiedemeier, Austin, TX (US); Eric John Lukes, Stewartville, MN (US); Carrie Ellen Cox, Apex, NC (US); Timothy O. Dickson, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 2 days.

(21) Appl. No.: 17/676,924

(22) Filed: Feb. 22, 2022

(65) Prior Publication Data
US 2023/0268908 A1    Aug. 24, 2023

(51) Int. Cl.
*H03K 3/017* (2006.01)
(52) U.S. Cl.
CPC .................... *H03K 3/017* (2013.01)
(58) Field of Classification Search
CPC ........................................ H03K 3/017
See application file for complete search history.

(56) References Cited

U.S. PATENT DOCUMENTS

| 8,401,098 B2 | 3/2013 | Bae et al. |
| 11,115,177 B2 | 9/2021 | Ke et al. |
| 2008/0197903 A1* | 8/2008 | Humble ............... H03K 5/1565 327/175 |
| 2009/0146743 A1* | 6/2009 | Kaneko ..................... H03L 7/08 331/16 |
| 2010/0284489 A1* | 11/2010 | Bae ...................... H04L 25/085 375/296 |

(Continued)

FOREIGN PATENT DOCUMENTS

WO    2021015867 A1    1/2021

OTHER PUBLICATIONS

Han et al., "Hybrid duty-cycle corrector circuit with dual feedback loop," Electronics Letters, vol. 47, No. 24, Nov. 24, 2011, 2 pages.
(Continued)

*Primary Examiner* — Sibin Chen
(74) *Attorney, Agent, or Firm* — Cantor Colburn LLP; Nathan Rau

(57) ABSTRACT

Aspects of the invention include receiving, by a controller, an indication of a chip initialization for a duty cycle correction (DCC) circuit, wherein the duty cycle correction circuit includes a main path including a main multiplexer (MUX) having a first input and a main driver circuit, a replica path including a replica MUX having a second input and a replica driver circuit, a selection MUX connected to the main path and the replica path, operating the selection MUX, during a period for the chip initialization, to select the main path as an input to the selection MUX, inputting a pre-defined data pattern to the main path, comparing an output of the selection MUX with the pre-defined data pattern to determine duty cycle issue, and generating an adjustment vector based on the determined duty cycle issue.

20 Claims, 7 Drawing Sheets

(56) References Cited

U.S. PATENT DOCUMENTS

2016/0241249 A1\* 8/2016 Balamurugan ......... H04L 25/03
2019/0215146 A1\* 7/2019 Ke .......................... H04L 7/042

OTHER PUBLICATIONS

Melikyan et al., "Serializer/Deserializer Output Data Signal Duty Cycle Correction Method," Proceedings of 57th Etran Conference, Jun. 3-6, 2013, 4 pages.

\* cited by examiner

DUAL DUTY CYCLE CORRECTION LOOP FOR A SERIALIZER/DESERIALIZER (SERDES) TRANSMITTER OUTPUT

BACKGROUND

The present invention generally relates to duty cycle correction, and more specifically, to a dual duty cycle correction loop for a serializer/deserializer (SerDes) transmitter output.

A typical communications link includes a transmitter, a receiver, and a channel that connects the transmitter to the receiver. The transmitter is configured to transmit a serial data bit stream across the channel to the receiver. Typical high-speed transmit data rates can be as high as 50 Gbps (gigabits per second) or more. Communications links operating at such high data rates are often referred to as high-speed serial links or high-speed input/output (I/O) links.

The data output from the transmitter often suffers from duty cycle distortion (DCD). In a half-rate clocking system where the output data is triggered at both rising and falling clock edges of a transmitter clock signal, a non-ideal duty cycle of the transmitter clock signal (i.e., a duty cycle other than 50%) will cause the output data to be distorted. A quarter-rate clocking system has the similar issues since both the in-phase and quadrature clocks could have non-ideal duty cycles. In addition, the phase difference between the in-phase clock and quadrature clock could be non-ideal. Even if the transmitter clock were to exhibit an ideal duty cycle of 50%, unbalanced rise and fall times in the transmitter data path can also cause the output data to be distorted.

SUMMARY

Embodiments of the present invention are directed to a computer-implemented method for a dual duty cycle correction loop in a serializer/deserializer (SerDes) transmitter. A non-limiting example computer-implemented method includes receiving, by a controller, an indication of a chip initialization for a duty cycle correction (DCC) circuit, wherein the duty cycle correction circuit includes a main path including a main multiplexer (MUX) having a first input and a main driver circuit, a replica path including a replica MUX having a second input and a replica driver circuit, a selection MUX connected to the main path and the replica path, operating the selection MUX, during a period for the chip initialization, to select the main path as an input to the selection MUX, inputting a pre-defined data pattern to the main path, comparing an output of the selection MUX with the pre-defined data pattern to determine duty cycle issue, and generating an adjustment vector based on the determined duty cycle issue.

Other embodiments of the present invention implement features of the above-described method in computer systems and computer program products.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
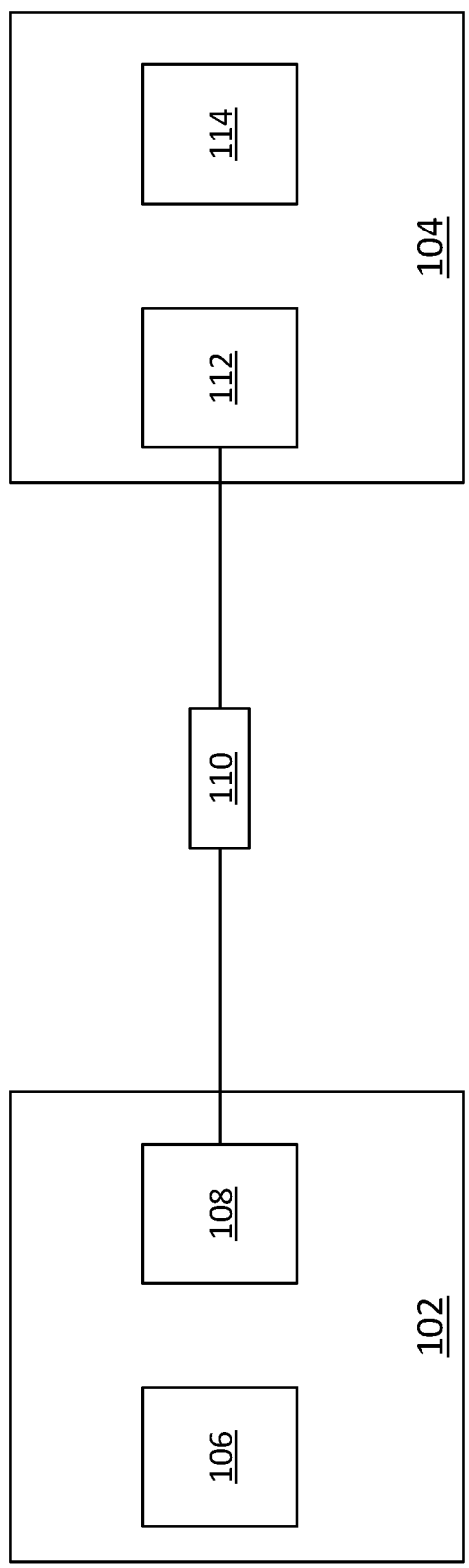
FIG. 1 illustrates a high-speed communications system according to one or more embodiments of the present invention.

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

One or more embodiments of the present invention provide for a dual duty cycle correction loop with a calibration scheme for a serializer/deserializer (SerDes) transmitter.

In high-speed SerDes applications, transmitter output duty cycle degradation (DCD) needs to be minimized to achieve desired link performance for the SerDes system. DCD can be especially problematic for SerDes applications using over 50 gigabits per second (Gbps) links with deep Si nodes. For example, a driver DCD could account for about one percent of the differential DCD in a 7 nm fin field-effect transistor (FinFET) technology at 50 Gbps. Also, any replica path at this speed will consume significant power and introduce mismatches compared to the main path. These mismatches need to be minimized without increasing the size and power of the replica path.

One or more embodiments of the present invention address one or more of the above described issues by providing a dual-loop system to correct the DCD at a transmitter output. In this system, both the main loop and the replica loop include the clock path, part of the serializer, and a driver. DCD due to process mismatch is corrected with the main loop at the chip powerup with a pre-set clock pattern. DCD due to voltage and temperature drift after chip powerup is corrected with a replica loop with a pre-set clock pattern. The mismatch between the main loop and the replica loop is calibrated with a calibration routine. As a result, a smaller size replica path can be used to save power. Further, all the DCD components are corrected to achieve an accurate duty cycle at transmitter output. This correction is also done in a low power manner to save power compared to conventional techniques.

In one or more embodiments of the invention, the system includes dual loops. A main duty cycle correction (DCC) loop uses a real path and a "1010" driver pattern at chip start to correct the DCD at the driver output due to process variations. A replica DCC loops uses a replica path with a replica serializer multiplexer (MUX) and replica driver. The data for the replica path is wired such that a clock pattern at the driver output is achieved. The duty cycle mismatch between the replica and the real path is calibrated first. Then, the replica loop is running dynamically to remove the DCD due to voltage and temperature drift. The calibration procedure is performed by two different means. A first scheme is defined that utilizes a shared duty cycle detection logic and circuit. A second scheme is defined that utilizes duty cycle correction logic and circuits in the replica path.

FIG. 1 is a diagram of an illustrative high-speed communications system 100. As shown in FIG. 1, system 100 may include components such as integrated circuits 102 and 104. Integrated circuits 102 and 104 may be, for example, application-specific integrated circuits (ASICs), programmable integrated circuits such as programmable logic devices (PLDs) or other integrated circuits that contain programmable elements, memory circuits, digital signal processors, microprocessors, or any other suitable integrated circuits. Circuits 102 and 104 may be different types of integrated circuits. For example, circuit 102 may be a programmable logic device (PLD) and circuit 104 may be an ASIC, or vice versa. Integrated circuits 102 and 104 may contain circuitry such as core logic circuits 106 and 114. Circuits 106 and 114 may be, for example, digital logic circuits. Circuit 106 may produce data that is to be transmitted from integrated circuit 102 to integrated circuit 104 over link 110. Circuit 114 may consume data that has been received at the receiving end of link 110. Transmitter 108 may be configured to transmit data from circuit 106 to receiver 112 over channel 110. Transmitter 108 may, for example, be implemented as part of integrated circuit 102. Receiver 112 may, as an example, be implemented as part of integrated circuit 104. Channel 110 may be formed from any suitable physical transmission medium. Examples of transmission paths that may be used in channel 110 include differential signaling paths made up of pairs of conductive wires, single conductive paths, coaxial cable paths and other transmission-line paths, paths on printed circuit boards, combinations of such paths, or other suitable communications link paths. In a typical system, integrated circuits 102 and 104 may be mounted on one or more circuit boards and channel 110 may involve transmission line structures fabricated on the circuit board or boards.

In the example of FIG. 1, integrated circuit 102 contains a single transmitter 108, and integrated circuit 104 contains a single corresponding receiver 112. A single channel 110 is used to connect transmitter 108 to receiver 112. This is merely illustrative. If desired, integrated circuit 102 may contain multiple transmitters such as transmitter 108, and integrated circuit 104 may contain multiple corresponding receivers such as receiver 112. Multiple communications paths may be used to link the various transmitters and receivers. Integrated circuit 102 may also include one or more receivers that receive data from one or more corresponding transmitters on integrated circuit 104. Data may also be conveyed to and from additional integrated circuits using transmitters and receivers such transmitter 108 and receiver 112. Transmitter 108 may be configured to transmit a serial data bit stream across channel 110 to receiver 112. Typical high-speed transmit data rates can be as high as 50 Gbps (gigabits per second) or more. Communications links operating at such high data rates are sometimes referred to as high-speed serial links or high-speed input/output links. Transmitter 108 may be controlled by a transmit clock signal such as signal Clk. Transmitter 108 may generate output data at a rate that is proportional to signal Clk. Embodiments herein generally relate to a half-rate clocking scheme in which the output data toggles at both rising and falling clock edges of signal Clk. For example, a 10 Gbps serial data stream can be transmitted using a 5 GHz clock. As another example, a 50 Gbps serial bit stream can be transmitted using a 25 GHz clock signal. Embodiments herein also apply to a quarter-rate clocking scheme in which the output data toggles at both rising and falling clock edges of in-phase and quadrature clocks. For example, a 10 Gbps serial data stream can be transmitted using 2.5 GHz in-phase and quadrature clocks. As another example, a 50 Gbps serial bit stream can be transmitted using a 12.5 GHz in-phase and quadrature clocks.

In a half-rate clocking system, the output data generated by transmitter 108 often suffers from duty cycle distortion ("DCD"). There may be at least two different sources of DCD: a first type of DCD may be caused by clock duty cycle distortion (i.e., by a non-ideal clock signal with a duty cycle other than 50%), whereas a second type of DCD may be caused by data duty cycle distortion (i.e., by mismatched rise and fall times of the transmitter output driver).

Figure 2:
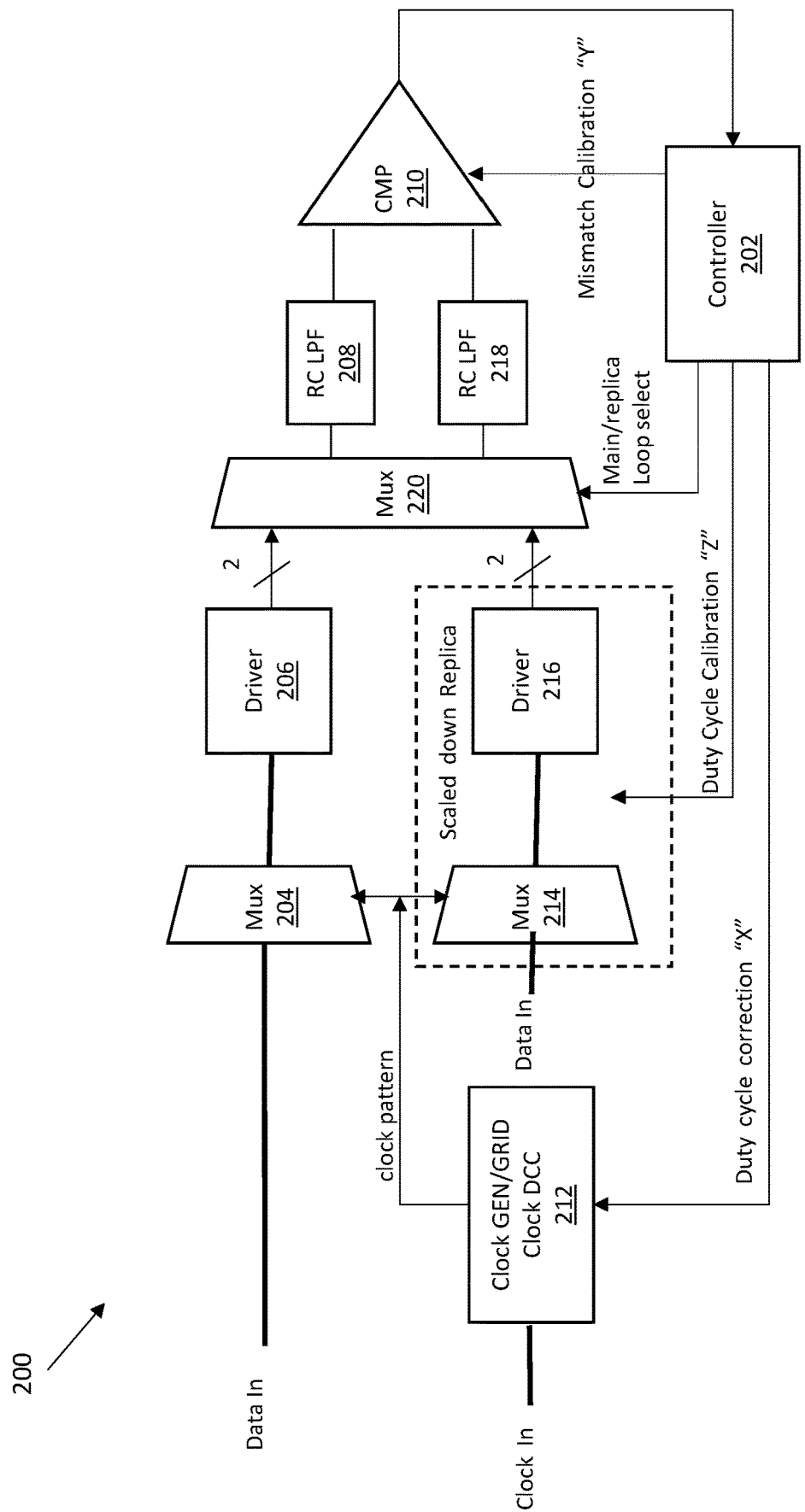
FIG. 2 depicts a block diagram of a dual duty cycle correction (DCC) circuit according to one or more embodiments of the present invention.

FIG. 2 depicts a block diagram of a dual duty cycle correction (DCC) circuit according to one or more embodiments of the invention. The DCC circuit 200 includes a main (first) DCC path (loop) and a replica (second) DCC path (loop). The main DCC path includes a data input for a main multiplexer (MUX) 204 and a main driver 206 that outputs to a selection MUX 220. The replica DCC path includes a replica MUX 214 that receives a clock signal as an input and outputs to a replica driver 216 which outputs to the selection MUX 220. The selection MUX 220 includes two outputs to respective low pass filters (LPF) 208, 218 which output to a comparator 210. In one or more embodiments, the comparator is an auto-zero comparator with built-in offset calibration. The auto-zero comparator was selected to reduce sources of error and increase accuracy of the comparator. With auto-zero comparator, the input dc offset of the comparator is calibrated automatically. For example, a calibration clock can be used to calibrate the comparator input dc offset when the clock is in high level. The inputs are compared when the calibration clock is in low level. Other auto-zero schemes can also be used with the comparator. The output of the comparator 210 is connected to a controller 202. The controller 202 is configured to operate the selection MUX 220 and the clock generator/Grid Clock DCC 212. In one or more embodiments, 212 may include clock divider, delay lines, clock buffers, and duty cycle tuning circuits. Those circuits are used to generate multi-phase clocks with delay and duty cycle tuning features for half-rate and quarter rate clocking applications. For quarter-rate clocking scheme, 212 includes a clock divider to generate in-phase and quadrature clocks. Besides, it also includes the circuits to tune the duty cycle and phase skew of the in-phase and quadrature clocks.

In one or more embodiments of the invention, the DCC circuit 200 operates to adjust a clock duty cycle during operation of a SERDES transmitter to achieve a 50% duty cycle for the driver output during said operation. When serializing data, the clock duty cycle corresponds to rising and falling edges which trigger the serializing MUX (main MUX 204) and allows for better serial data transmission when at 50% clock duty cycle. As mentioned briefly above, clock duty cycle can vary due to a variety of conditions including processing, voltage, and temperature (PVT) conditions. The DCC circuit 200 utilizes the two paths to address duty cycle degradation in a clock path and reduce clock path mismatch. In one or more embodiments of the present invention, the main DCC path is utilized to correct the duty cycle degradation at a driver output due to process variations. This is achieved while during a chip start up (initialization) period, the data in for the main DCC path will be a pre-determined data pattern. For half-rate clocking scheme, "1010" data pattern can be used to produce a "1010" pattern at driver output. For quarter-rate clocking scheme, separate data patterns need to be used to correct the duty cycle and phase skew of the in-phase and quadrature clocks. For example, "0110" data pattern can be used to tune the duty cycle of in-phase clock while "0011" can be used to tune the duty cycle of the quadrature clock. Then, "0101" data pattern can be used to tune the delay skew between in-phase and quadrature clocks. With the known pattern being input into the main MUX 204, the controller 202 can operate the selection MUX 220 to select the output from the main driver 206. The comparator 210 is utilized to output the data to the controller 202 to analyze and determine that any duty cycle degradation (i.e., not 50%) is occurring. The controller 202 then generates a vector X based on the output from the comparator 210 and supplies the vector X to the clock GEN/Grid clock DCC 212 to account for the duty cycle degradation. Depending on half rate or quarter-rate clock schemes and thus corresponding data pattern to be used, the vector X can delay the clock signals or adjust their duty cycles to make duty cycle of the output of driver 206 to be 50%.

Figure 3:
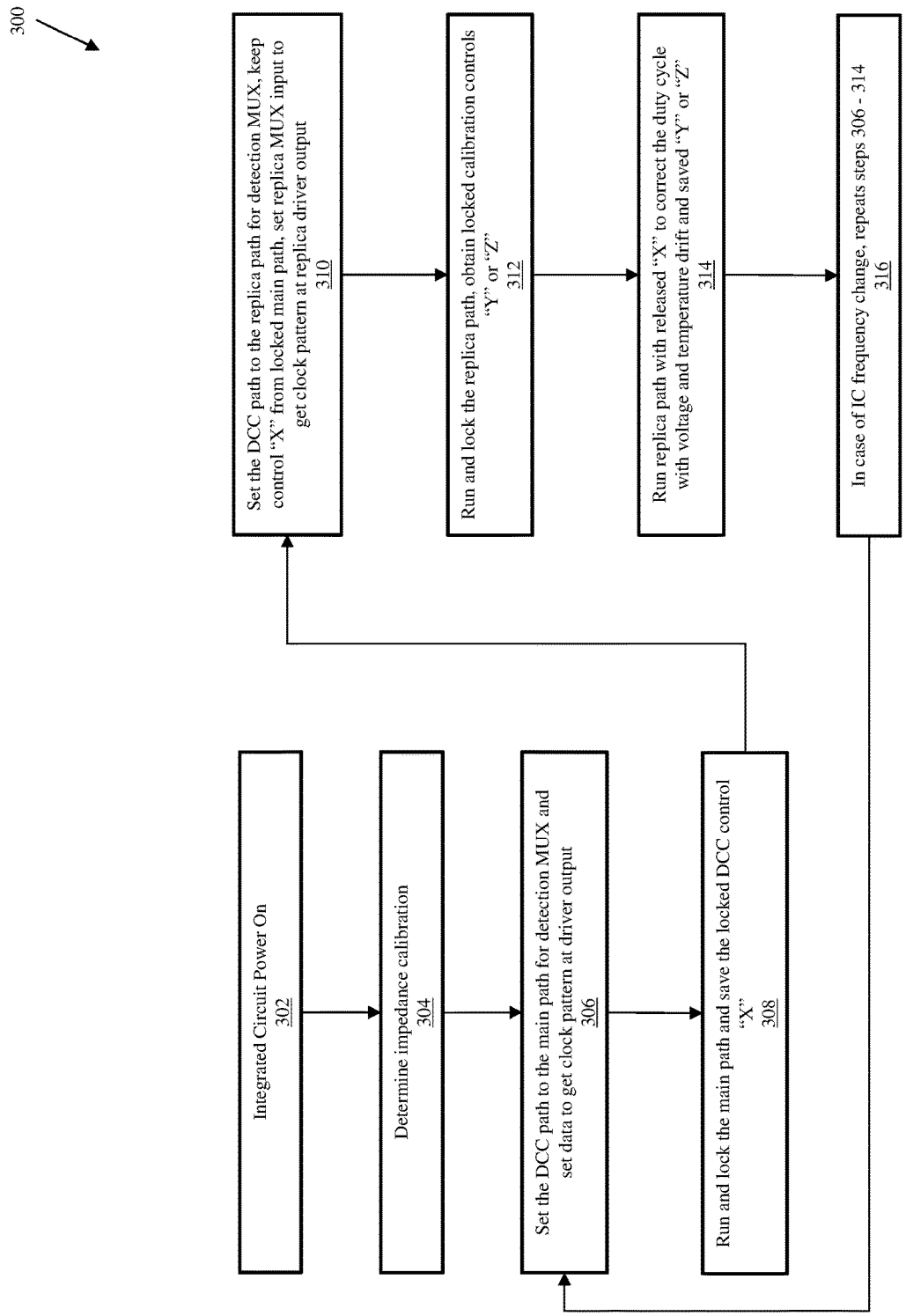
FIG. 3 depicts a flow diagram of a method for duty cycle correction in a serializer/deserializer (SerDes) transmitter according to one or more embodiments of the present invention.

In one or more embodiments of the invention, after the start up period and the adjustment to any duty cycle degradation, the controller 202 can then change the selection MUX 220 to select the input from the replica path. The replica path receives the same clock input from the main DCC path. The input replica path can be wired or programmed with a designated pattern, similar to what is used at the Data In to mux 204 as stated above. The comparator 210 then compares the common mode from the RC low pass filter 208 and 218 of the clock and its complement from the replica path. If the replica path perfectly matches the main path, that is, if mux 214 matches mux 204 and driver 216 matches driver 206, then the duty cycle loop still locks and the comparator 210 is in its metastable state with the main DCC vector X. However, due to process mismatch in small technology node and scaling down its size in the replica path to save power, the replica path usually has some mismatch with the main path. As a result, the replica DCC loop will not lock with the vector X which is from locking the main DCC loop. In one embodiments of the invention, a duty cycle calibration vector Z is generated from the controller 202 and provided to the replica path to adjust the clock duty cycle of the replica path. In the initial power on state, the vector Z is "0" and there is no adjustment on the replica path. After the controller switches the mux 220 from the main loop to replica loop, the vector X is kept the same while the vector Z is varied until the comparator 210 is back to metastable state and the replica loop is locked. In this way, the mismatch between the main path and replica path is calibrated. Then, the vector Z is kept the same and the replica loop continues to run to change the vector X to dynamically track the duty cycle variation due to voltage and temperature changes. In other embodiments of the invention, a mismatch calibration vector Y (instead of duty cycle calibration vector Z) is generated from the controller 202 and provided to the comparator 210 to compensate for the mismatch between the main path and replica path. In the initial power on state, the vector Y is "0" and there is no adjustment on the comparator offset. After the controller switches the mux 220 from the main loop to replica loop, the vector X is kept the same while the vector Y is varied until the comparator 210 is back to metastable state and the replica loop is locked. In this way, the mismatch between the main path and replica path is calibrated. Then, the vector Y is kept the same and the replica loop continues to run to change the vector X to dynamically track the duty cycle variation due to voltage and temperature changes. The procedure stated above is mostly simplified for half-rate clocking scheme where there is only one clock. For quarter-rate clocking schemes, three different loop procedure need to be run for each data pattern. With in-phase clock and data pattern "0110", the controller 202 could generate X1, Y1 (or Z1) for the duty cycle tuning. With quadrature clock and data pattern "0011", the controller 202 could generate X2, Y2 (or Z2) for the duty cycle tuning. With data pattern "0101", the controller 202 could generate X3, Y3 (or Z3) for delay skew tuning between in-phase and quadrature clocks. So, vector X, Y or Z are each three set of control vectors for quarter-rate clocking systems. A detailed flowchart for a typical transmitter system is shown on FIG. 3.

Figure 6:
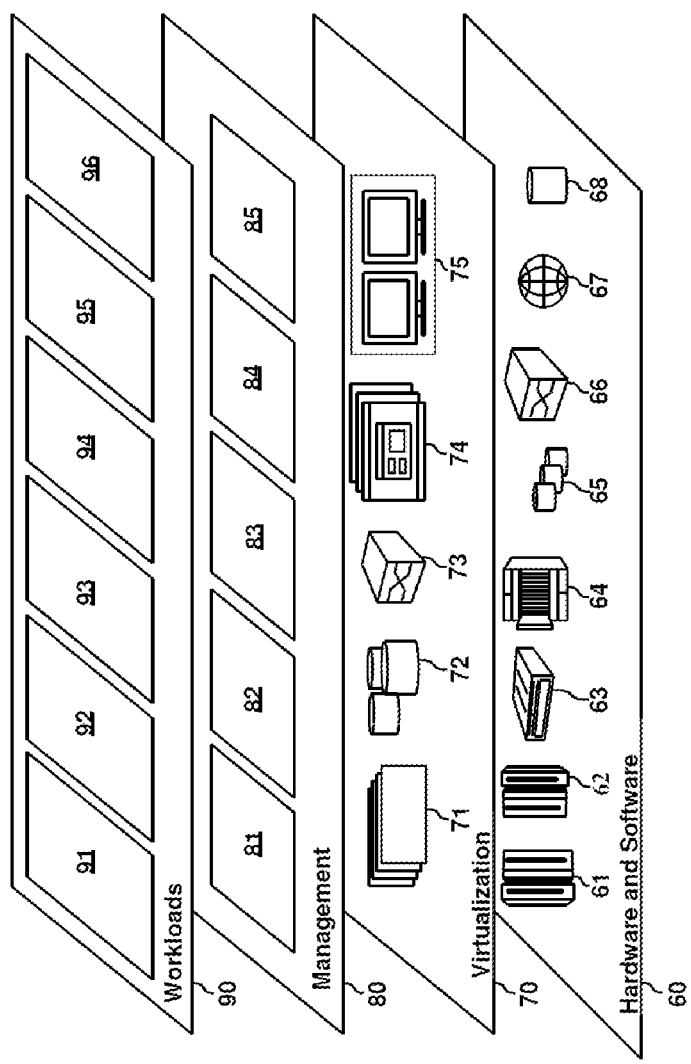
FIG. 6 depicts abstraction model layers according to one or more embodiments of the present invention.
Figure 7:
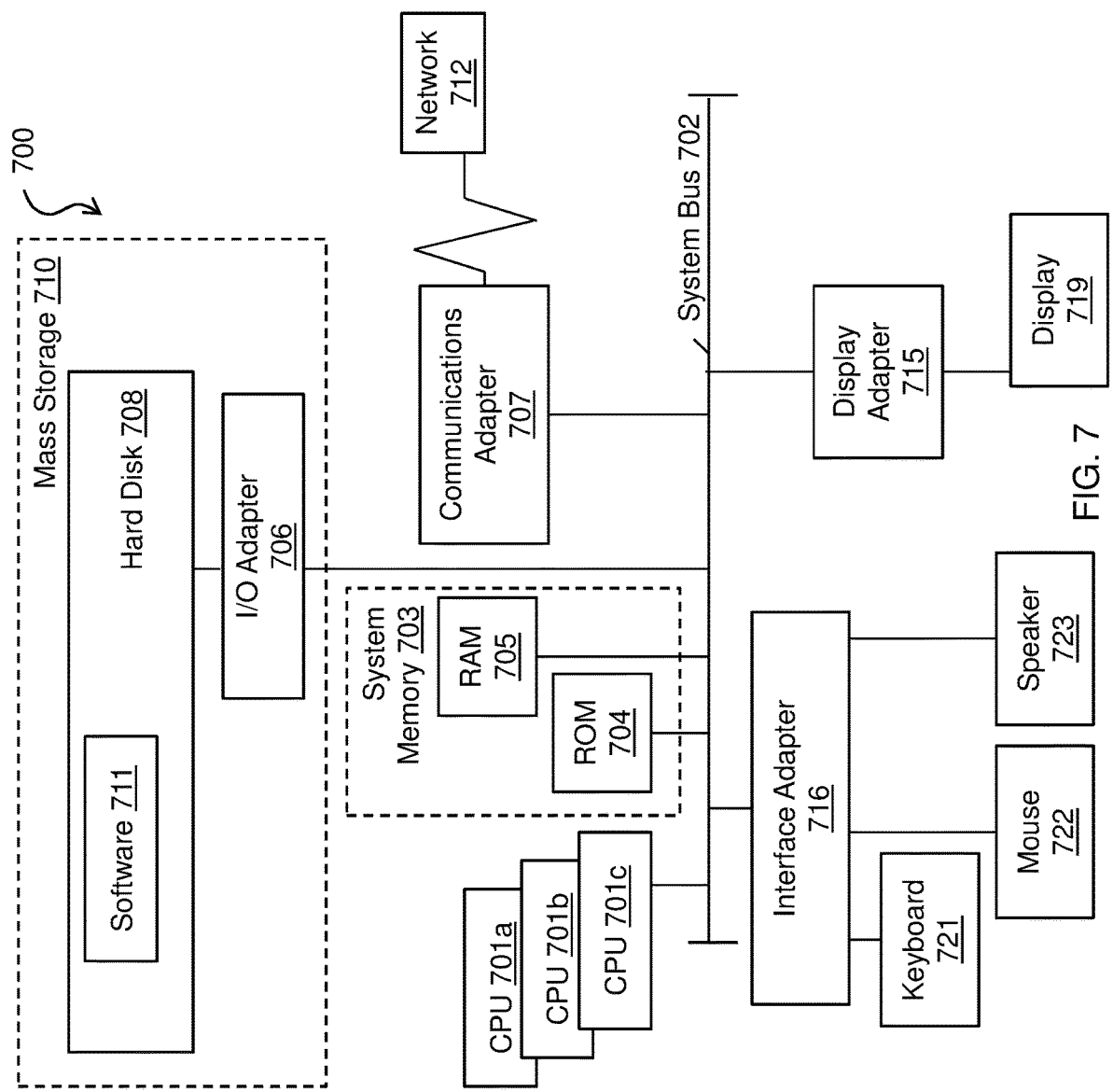
FIG. 7 depicts a computer system according to one or more embodiment of the present invention.

In one or more embodiments of the invention, the controller 202 and any of the components on the system 200 can be implemented on the processing system 700 found in FIG. 7. Additionally, the cloud computing system 50 can be in wired or wireless electronic communication with one or all of the elements of the system 200. Cloud 50 can supplement, support or replace some or all of the functionality of the elements of the system 200. Additionally, some or all of the functionality of the elements of system 200 can be implemented as a node 10 (shown in FIGS. 5 and 6) of cloud 50. Cloud computing node 10 is only one example of a suitable cloud computing node and is not intended to suggest any limitation as to the scope of use or functionality of embodiments of the invention described herein.

Figure 4:
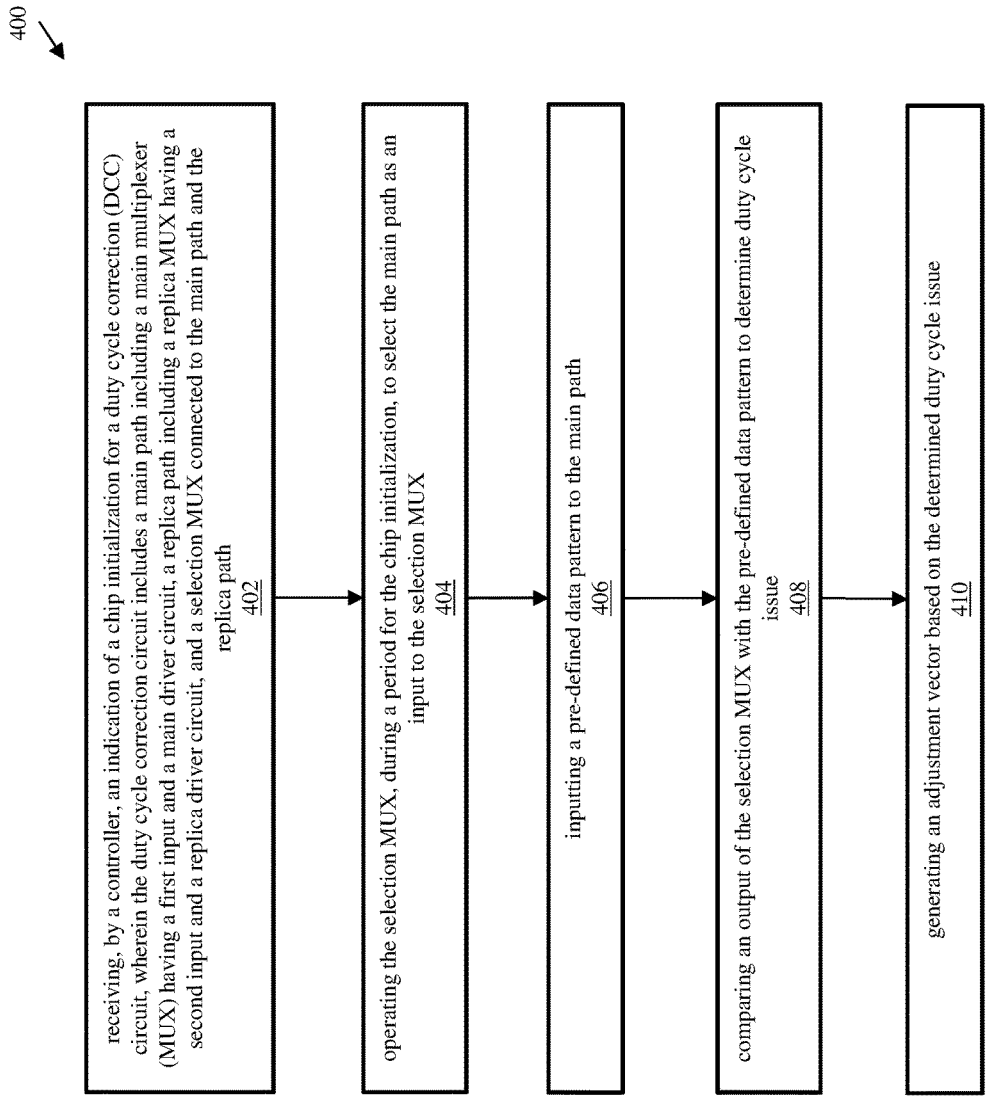
FIG. 4 depicts a flow diagram of a method for duty cycle correction in a serializer/deserializer (SerDes) transmitter according to one or more embodiments of the present invention.

FIG. 4 depicts a flow diagram of a method 400 for duty cycle correction in a SERDES transmitter according to one or more embodiments of the invention. At least a portion of the method 400 can be executed, for example, by the one or more processors 701 from FIG. 7. The method 400 includes receiving, by a controller, an indication of a chip initialization for a duty cycle correction (DCC) circuit, wherein the duty cycle correction circuit includes a main path including a main multiplexer (MUX) having a first input and a main driver circuit, a replica path including a replica MUX having a second input and a replica driver circuit, and a selection MUX connected to the main path and the replica path, as shown in block 402. At block 404, the method 400 includes operating the selection MUX, during a period for the chip initialization, to select the main path as an input to the selection MUX. Also, at block 406, the method 400 includes inputting a pre-defined data pattern to the main path. This pre-defined pattern can be any type of pattern including a "1010" pattern, for example. Also, the method 400 includes comparing the clock common mode of the clock and its complements through low pass filters. And at block 410, the method 400 includes generating an adjustment vector based on the determined duty cycle issue.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 5:
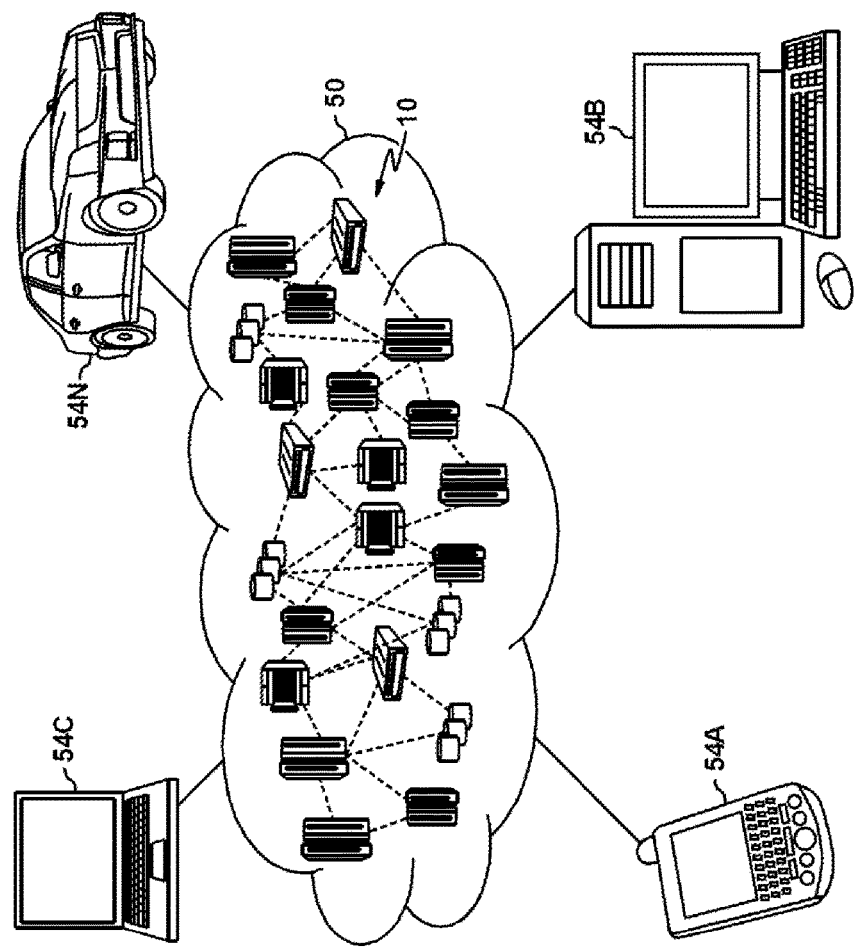
FIG. 5 depicts a cloud computing environment according to one or more embodiments of the present invention.

Referring now to FIG. 5, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 5 are intended to be illustrative only and that computing nodes 10 and cloud computing environment 50 can communicate with any type of computerized device over any type of network and/or network addressable connection (e.g., using a web browser).

Referring now to FIG. 6, a set of functional abstraction layers provided by cloud computing environment 50 (FIG. 5) is shown. It should be understood in advance that the components, layers, and functions shown in FIG. 6 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and dual loop duty cycle correction 96.

Turning now to FIG. 7, a computer system 700 is generally shown in accordance with an embodiment. The computer system 700 can be an electronic, computer framework comprising and/or employing any number and combination of computing devices and networks utilizing various communication technologies, as described herein. The computer system 700 can be easily scalable, extensible, and modular, with the ability to change to different services or reconfigure some features independently of others. The computer system 700 may be, for example, a server, desktop computer, laptop computer, tablet computer, or smartphone. In some examples, computer system 700 may be a cloud computing node. Computer system 700 may be described in the general context of computer system executable instructions, such as program modules, being executed by a computer system. Generally, program modules may include routines, programs, objects, components, logic, data structures, and so on that perform particular tasks or implement particular abstract data types. Computer system 700 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 7, the computer system 700 has one or more central processing units (CPU(s)) 701a, 701b, 701c, etc. (collectively or generically referred to as processor(s) 701). The processors 701 can be a single-core processor, multi-core processor, computing cluster, or any number of other configurations. The processors 701, also referred to as processing circuits, are coupled via a system bus 702 to a system memory 703 and various other components. The system memory 703 can include a read only memory (ROM) 704 and a random access memory (RAM) 705. The ROM 704 is coupled to the system bus 702 and may include a basic input/output system (BIOS), which controls certain basic functions of the computer system 700. The RAM is read-write memory coupled to the system bus 702 for use by the processors 701. The system memory 703 provides temporary memory space for operations of said instructions during operation. The system memory 703 can include random access memory (RAM), read only memory, flash memory, or any other suitable memory systems.

The computer system 700 comprises an input/output (I/O) adapter 706 and a communications adapter 707 coupled to the system bus 702. The I/O adapter 706 may be a small computer system interface (SCSI) adapter that communicates with a hard disk 708 and/or any other similar component. The I/O adapter 706 and the hard disk 708 are collectively referred to herein as a mass storage 710.

Software 711 for execution on the computer system 700 may be stored in the mass storage 710. The mass storage 710 is an example of a tangible storage medium readable by the processors 701, where the software 711 is stored as instructions for execution by the processors 701 to cause the computer system 700 to operate, such as is described herein below with respect to the various Figures. Examples of computer program product and the execution of such instruction is discussed herein in more detail. The communications adapter 707 interconnects the system bus 702 with a network 712, which may be an outside network, enabling the computer system 700 to communicate with other such systems. In one embodiment, a portion of the system memory 703 and the mass storage 710 collectively store an operating system, which may be any appropriate operating system, such as the z/OS or AIX operating system from IBM Corporation, to coordinate the functions of the various components shown in FIG. 7.

Additional input/output devices are shown as connected to the system bus 702 via a display adapter 715 and an interface adapter 716 and. In one embodiment, the adapters 706, 707, 715, and 716 may be connected to one or more I/O buses that are connected to the system bus 702 via an intermediate bus bridge (not shown). A display 719 (e.g., a screen or a display monitor) is connected to the system bus 702 by a display adapter 715, which may include a graphics controller to improve the performance of graphics intensive applications and a video controller. A keyboard 721, a mouse 722, a speaker 723, etc. can be interconnected to the system bus 702 via the interface adapter 716, which may include, for example, a Super I/O chip integrating multiple device adapters into a single integrated circuit. Suitable I/O buses for connecting peripheral devices such as hard disk controllers, network adapters, and graphics adapters typically include common protocols, such as the Peripheral Component Interconnect (PCI). Thus, as configured in FIG. 7, the computer system 700 includes processing capability in the form of the processors 701, and, storage capability including the system memory 703 and the mass storage 710, input means such as the keyboard 721 and the mouse 722, and output capability including the speaker 723 and the display 719.

In some embodiments, the communications adapter 707 can transmit data using any suitable interface or protocol, such as the internet small computer system interface, among others. The network 712 may be a cellular network, a radio network, a wide area network (WAN), a local area network (LAN), or the Internet, among others. An external computing device may connect to the computer system 700 through the network 712. In some examples, an external computing device may be an external webserver or a cloud computing node.

It is to be understood that the block diagram of FIG. 7 is not intended to indicate that the computer system 700 is to include all of the components shown in FIG. 7. Rather, the computer system 700 can include any appropriate fewer or additional components not illustrated in FIG. 7 (e.g., additional memory components, embedded controllers, modules, additional network interfaces, etc.). Further, the embodiments described herein with respect to computer system 700 may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method comprising:
receiving, by a controller, an indication of a chip initialization for a duty cycle correction (DCC) circuit, wherein the duty cycle correction circuit comprises:
a main path including a main multiplexer (MUX) having a first input to receive a pre-defined data pattern and a first output connected to a main driver input of a main driver circuit;
a replica path including a replica MUX having a second input to receive the pre-defined data pattern and a second output connected to a replica driver input of a replica driver circuit;
a selection MUX connected to the main path to receive a first main driver output and a second main driver output, and connected to the replica path to receive a first replica driver output and a second replica driver output;
operating the selection MUX, during a period for the chip initialization, to select the first and second main driver outputs as inputs to the selection MUX;
inputting the pre-defined data pattern to the main path;
comparing the first main driver output having a first portion of the pre-defined data pattern with the second main driver output having a second portion of the pre-defined data pattern to determine duty cycle issue; and
generating an adjustment vector based on the determined duty cycle issue.

2. The computer-implemented method of claim 1, further comprising:
inputting the adjustment vector to a clock circuit to adjust a duty cycle of a clock signal for the DCC circuit.

3. The computer-implemented method of claim 1, further comprising:
receiving, by the controller, a second indication of an expiration of the chip initialization period for the DCC circuit;
operating the selection MUX to select the first and second replica driver outputs as inputs to the selection MUX;
inputting the pre-defined data pattern to the replica path;
comparing first replica driver output having a first portion of the pre-defined data pattern with the second replica driver output having a second portion of the pre-defined data pattern to determine a path mismatch issue; and
generating a second adjustment vector based on the determined path mismatch issue.

4. The computer-implemented method of claim 3, further comprising:
inputting the second adjustment vector to the comparator to adjust for the path mismatch issue.

5. The computer-implemented method of claim 3, further comprising:
inputting the second adjustment vector to the replica driver to adjust for the path mismatch issue.

6. The computer-implemented method of claim 1, wherein an output of the selection MUX is connected to a low pass filter.

7. The computer-implemented method of claim 1, wherein the main MUX is a serializer for a serializer/deserializer (SerDes) system.

8. A system comprising:
a memory having computer readable instructions; and
one or more processors for executing the computer readable instructions, the computer readable instructions controlling the one or more processors to perform operations comprising:
receiving an indication of a chip initialization for a duty cycle correction (DCC) circuit, wherein the duty cycle correction circuit comprises:
a main path including a main multiplexer (MUX) having a first input to receive a pre-defined data pattern and a first output connected to a main driver input of a main driver circuit;
a replica path including a replica MUX having a second input to receive the pre-defined data pattern and a second output connected to a replica driver input of a replica driver circuit;
a selection MUX connected to the main path to receive a first main driver output and a second main driver output, and connected to the replica path to receive a first replica driver output and a second replica driver output;
operating the selection MUX, during a period for the chip initialization, to select the first and second main driver outputs as inputs to the selection MUX;
inputting the pre-defined data pattern to the main path;
comparing the first main driver output having a first portion of the pre-defined data pattern with the second main driver output having a second portion of the pre-defined data pattern to determine a duty cycle issue; and
generating an adjustment vector based on the determined duty cycle issue.

9. The system of claim 8, wherein the operations further comprise:
inputting the adjustment vector to a clock circuit to adjust a duty cycle of a clock signal for DCC circuit.

10. The system of claim 8, wherein the operations further comprise:
receiving, by the controller, a second indication of an expiration of the chip initialization period for the DCC circuit;
operating the selection MUX to select the first and second replica driver outputs as inputs to the selection MUX;
inputting the pre-defined data pattern to the replica path; and
comparing first replica driver output having a first portion of the pre-defined data pattern with the second replica driver output having a second portion of the pre-defined data pattern to determine a path mismatch issue; and
generating a second adjustment vector based on the determined path mismatch issue.

11. The system of claim 10, wherein the operations further comprise:
inputting the second adjustment vector to the comparator to adjust for the path mismatch issue.

12. The system of claim 10, further comprising:
inputting the second adjustment vector to the replica driver to adjust for the path mismatch issue.

13. The system of claim 8, wherein an output of the selection MUX is connected to a low pass filter.

14. The system of claim 8, wherein the main MUX is a serializer for a serializer/deserializer (SERDES) system.

15. A computer program product comprising a computer readable storage medium having program instructions embodied therewith, the program instructions executable by one or more processors to cause the one or more processors to perform operations comprising:
receiving, by a controller, an indication of a chip initialization for a duty cycle correction (DCC) circuit, wherein the duty cycle correction circuit comprises:

a main path including a main multiplexer (MUX) having a first input to receive a pre-defined data pattern and a first output connected to a main driver input of a main driver circuit;

a replica path including a replica MUX having a second input to receive the pre-defined data pattern and a second output connected to a replica driver input of a replica driver circuit;

a selection MUX connected to the main path and the replica path;

operating the selection MUX, during a period for the chip initialization, to select the first and second main driver outputs as inputs to the selection MUX;

inputting the pre-defined data pattern to the main path;

comparing the first main driver output having a first portion of the pre-defined data pattern with the second main driver output having a second portion of the pre-defined data pattern to determine duty cycle issue; and generating an adjustment vector based on the determined duty cycle issue.

16. The computer program product of claim 15, wherein the operations further comprise:

inputting the adjustment vector to a clock circuit to adjust a duty cycle of a clock signal for DCC circuit.

17. The computer program product of claim 15, wherein the operations further comprise:

receiving, by the controller, a second indication of an expiration of the chip initialization period for the DCC circuit;

operating the selection MUX to select the first and second replica driver outputs as inputs to the selection MUX;

inputting the pre-defined data pattern to the replica path;

comparing first replica driver output having a first portion of the pre-defined data pattern with the second replica driver output having a second portion of the pre-defined data pattern to determine a path mismatch issue; and generating a second adjustment vector based on the determined path mismatch issue.

18. The computer program product of claim 17, wherein the operations further comprise:

inputting the second adjustment vector to the comparator to adjust for the path mismatch issue.

19. The computer program product of claim 17, wherein the operations further comprise:

inputting the second adjustment vector to the replica driver to adjust for the path mismatch issue.

20. The computer program product of claim 15, wherein an output of the selection MUX is connected to a low pass filter.

* * * * *